United States Patent
Swenson (10) Patent No.: US 12,373,167 B2
(45) Date of Patent: Jul. 29, 2025

(54) SYSTEMS AND METHODS FOR VARIABLE BANDWIDTH ANNEALING

(71) Applicant: D-WAVE SYSTEMS INC., Burnaby (CA)

(72) Inventor: Loren J. Swenson, San Jose, CA (US)

(73) Assignee: 1372934 B.C. LTD., Burnaby (CA)

( * ) Notice: Subject to any disclaimer, the term of this patent is extended or adjusted under 35 U.S.C. 154(b) by 1234 days.

(21) Appl. No.: 17/148,850

(22) Filed: Jan. 14, 2021

(65) Prior Publication Data

US 2021/0232364 A1     Jul. 29, 2021

Related U.S. Application Data

(60) Provisional application No. 62/966,395, filed on Jan. 27, 2020.

(51) Int. Cl.
| | |
|---|---|
| G06F 7/22 | (2006.01) |
| G06N 10/20 | (2022.01) |
| G06N 10/40 | (2022.01) |
| G06N 10/60 | (2022.01) |
| H03H 11/04 | (2006.01) |
| H03H 11/36 | (2006.01) |

(52) U.S. Cl.
CPC ............... *G06F 7/22* (2013.01); *G06N 10/20* (2022.01); *G06N 10/40* (2022.01); *G06N 10/60* (2022.01); *H03H 11/04* (2013.01); *H03H 11/36* (2013.01)

(58) Field of Classification Search
CPC ....................................................... G06F 7/22
USPC .......................................................... 706/62
See application file for complete search history.

(56) References Cited

U.S. PATENT DOCUMENTS 2,832,897 A  *  4/1958  Buck ...................... H10N 60/35
                                                          331/107 S
2,865,006 A  *  12/1958  Sabaroff .............. H03H 7/0123
                                                          333/248
(Continued)

FOREIGN PATENT DOCUMENTS

| CA | 2058837 A1 | 7/1992 |
| CA | 2379144 A1 | 2/2001 |

(Continued)

OTHER PUBLICATIONS

Blatter, et al., "Design aspects of superconducting-phase quantum bits," Physical Review B 63: 174511-1-174511-9, 2001.

(Continued)

*Primary Examiner* — Reza Nabi
(74) *Attorney, Agent, or Firm* — Cozen O'Connor (57) ABSTRACT

A filter multiplexer for variable bandwidth annealing selection is described. The filter multiplexer has multiple pathways, where each pathway comprises a switch and a filter. Each filter has a different cutoff frequency from the other filters. Switches may be cryogenic switches. Each pathway may be communicatively coupled to an external annealing line. Upon receiving a problem, an annealing bandwidth can be selected, set or configured via the multiplexer to operate a quantum processor with a desired annealing schedule. The multiplexer may be used for calibration of a quantum processor by performing a calibration with a large annealing bandwidth, then calibrating the quantum processor by iterating through all available annealing bandwidths from the multiplexer.

16 Claims, 7 Drawing Sheets

(56) References Cited

U.S. PATENT DOCUMENTS

| | | | | |
|---|---|---|---|---|
| 3,200,368 A * | 8/1965 | Stekly | H01F 6/065 | 29/874 |
| 3,267,396 A * | 8/1966 | Scott | H01P 1/202 | 333/167 |
| 3,380,004 A * | 4/1968 | Hansen | H01F 1/00 | 336/83 |
| 3,753,168 A * | 8/1973 | Schor | H03H 1/0007 | 333/185 |
| 3,766,502 A * | 10/1973 | Bronca | H01F 6/02 | 335/216 |
| 3,783,417 A * | 1/1974 | Osada | H03H 7/32 | 333/185 |
| 4,239,010 A * | 12/1980 | Amburn | G01V 3/12 | 340/684 |
| 4,342,013 A * | 7/1982 | Kallman | H02H 9/005 | 177/185 |
| 4,355,910 A * | 10/1982 | Quick | G01D 5/268 | 73/705 |
| 4,401,694 A * | 8/1983 | Quick | G01D 5/268 | 264/2.6 |
| 4,453,144 A * | 6/1984 | Tamura | H03H 1/00 | 333/140 |
| 4,464,640 A * | 8/1984 | Nishikawa | H01P 1/2056 | 333/202 |
| 4,707,184 A * | 11/1987 | Hashiguchi | C22C 32/0021 | 75/235 |
| 4,731,611 A * | 3/1988 | Muller | G01S 7/032 | 342/28 |
| 4,761,623 A * | 8/1988 | Schneider | H03H 1/0007 | 333/167 |
| 4,781,969 A * | 11/1988 | Kobayashi | H05K 1/09 | 428/209 |
| 4,797,596 A * | 1/1989 | Tsuzurahara | H01J 23/15 | 315/39 |
| 4,943,792 A * | 7/1990 | Srivastava | H10N 60/355 | 338/32 S |
| 4,947,118 A * | 8/1990 | Fujimaki | G01R 33/0356 | 327/527 |
| 4,952,896 A * | 8/1990 | Dawson, Jr. | H01R 13/7197 | 333/182 |
| 4,956,642 A * | 9/1990 | Harada | H03M 1/368 | 327/527 |
| 4,983,971 A * | 1/1991 | Przybysz | H03M 1/50 | 505/864 |
| 5,083,101 A * | 1/1992 | Frederick | H03H 1/0007 | 336/212 |
| 5,128,675 A * | 7/1992 | Harada | H03M 1/785 | 341/149 |
| 5,146,191 A * | 9/1992 | Mandai | H03H 7/34 | 333/140 |
| 5,150,086 A * | 9/1992 | Ito | H01R 13/7195 | 333/182 |
| 5,162,731 A * | 11/1992 | Fujimaki | G01R 33/0356 | 505/846 |
| 5,173,660 A * | 12/1992 | Marsden | H10N 60/815 | 505/846 |
| 5,227,365 A * | 7/1993 | Van den Sype | H10N 60/0268 | 252/511 |
| 5,248,941 A * | 9/1993 | Lee | G01R 33/0356 | 327/527 |
| 5,313,176 A * | 5/1994 | Upadhyay | G11C 11/565 | 336/184 |
| 5,319,343 A * | 6/1994 | Jeffries | H01F 27/42 | 336/184 |
| 5,392,012 A * | 2/1995 | Iwata | H03H 9/605 | 310/355 |
| 5,398,030 A * | 3/1995 | Sandell | H03M 1/74 | 341/149 |
| 5,446,427 A * | 8/1995 | Nakayama | H03H 7/075 | 333/185 |
| 5,616,539 A * | 4/1997 | Hey-Shipton | H03H 7/0115 | 505/700 |
| 5,618,777 A * | 4/1997 | Hey-Shipton | H01F 6/06 | 505/700 |
| 5,831,489 A * | 11/1998 | Wire | H05K 9/0075 | 361/728 |
| 5,917,066 A * | 6/1999 | Eisenmann | B01D 46/0012 | 55/502 |
| 5,936,458 A * | 8/1999 | Rylov | H03K 3/38 | 505/855 |
| 5,937,263 A * | 8/1999 | Eisenmann | B01D 71/02232 | 419/49 |
| 5,939,955 A * | 8/1999 | Chen | H03H 7/0115 | 333/167 |
| 5,974,335 A * | 10/1999 | Talisa | H01P 9/02 | 505/700 |
| 6,026,311 A * | 2/2000 | Willemsen Cortes | H03H 2/00 | 336/200 |
| 6,094,110 A * | 7/2000 | Reddy | H03H 7/06 | 336/212 |
| 6,347,237 B1 * | 2/2002 | Eden | H01G 5/40 | 505/700 |
| 6,686,811 B2 * | 2/2004 | Hey-Shipton | H01P 1/205 | 333/202 |
| 6,825,748 B1 * | 11/2004 | Ibata | H03H 7/0115 | 336/200 |
| 6,838,694 B2 * | 1/2005 | Esteve | G11C 16/02 | 977/933 |
| 6,898,450 B2 | 5/2005 | Eden et al. | | |
| 7,129,870 B2 * | 10/2006 | Hirano | H03K 3/38 | 326/2 |
| 7,145,415 B2 * | 12/2006 | Sengupta | H01P 1/20 | 333/175 |
| 7,164,331 B2 * | 1/2007 | Reddy | H03H 7/463 | 336/212 |
| 7,335,909 B2 | 2/2008 | Amin et al. | | |
| 7,365,663 B2 * | 4/2008 | Rylov | H03M 1/1215 | 341/155 |
| 7,456,702 B2 | 11/2008 | Keefe et al. | | |
| 7,477,060 B2 * | 1/2009 | Yu | G01N 17/02 | 324/693 |
| 7,533,068 B2 | 5/2009 | Maassen et al. | | |
| 7,619,437 B2 | 11/2009 | Thom et al. | | |
| 7,624,088 B2 * | 11/2009 | Johnson | B82Y 10/00 | 706/62 |
| 7,733,253 B2 * | 6/2010 | Kirichenko | H03M 1/0604 | 341/155 |
| 7,791,430 B2 | 9/2010 | Keefe et al. | | |
| 7,800,395 B2 * | 9/2010 | Johnson | B82Y 10/00 | 326/1 |
| 7,843,209 B2 * | 11/2010 | Berkley | G06N 10/20 | 326/1 |
| 7,859,364 B2 * | 12/2010 | Sakisaka | H03H 7/1766 | 333/185 |
| 7,876,248 B2 | 1/2011 | Berkley et al. | | |
| 7,990,662 B2 | 8/2011 | Berkley et al. | | |
| 8,008,991 B2 | 8/2011 | Tcaciuc et al. | | |
| 8,073,808 B2 * | 12/2011 | Rose | G06V 30/1988 | 706/62 |
| 8,098,179 B2 | 1/2012 | Bunyk et al. | | |
| 8,159,313 B2 | 4/2012 | Uchaykin | | |
| 8,169,231 B2 * | 5/2012 | Berkley | G06N 10/40 | 326/4 |
| 8,179,133 B1 * | 5/2012 | Kornev | G01R 33/0354 | 324/225 |
| 8,190,548 B2 * | 5/2012 | Choi | G06N 10/60 | 706/46 |
| 8,195,596 B2 | 6/2012 | Rose et al. | | |
| 8,228,688 B2 | 7/2012 | Uchaykin et al. | | |
| 8,244,650 B2 * | 8/2012 | Rose | G06N 10/60 | 708/320 |
| 8,247,799 B2 * | 8/2012 | Bunyk | H10N 69/00 | 505/170 |
| 8,279,022 B2 | 10/2012 | Thom et al. | | |
| 8,315,678 B2 * | 11/2012 | Uchaykin | H05K 3/429 | 427/63 |
| 8,346,325 B2 | 1/2013 | Thom et al. | | |
| 8,421,053 B2 | 4/2013 | Bunyk et al. | | |

(56) References Cited

U.S. PATENT DOCUMENTS

| | | | | |
|---|---|---|---|---|
| 8,436,354 B2* | 5/2013 | Aoki | | H01L 24/97 257/E21.372 |
| 8,441,329 B2 | 5/2013 | Thom et al. | | |
| 8,441,330 B2* | 5/2013 | Uchaykin | | H01F 13/006 335/214 |
| 8,536,566 B2* | 9/2013 | Johansson | | H03K 19/195 257/31 |
| 8,604,669 B2* | 12/2013 | Hsieh | | G01R 15/183 310/339 |
| 8,670,807 B2 | 3/2014 | Rose et al. | | |
| 8,738,105 B2 | 5/2014 | Berkley et al. | | |
| 8,745,850 B2 | 6/2014 | Farinelli et al. | | |
| 8,786,476 B2 | 7/2014 | Bunyk et al. | | |
| 8,854,704 B2* | 10/2014 | Takahashi | | H04N 1/40056 358/475 |
| 9,203,134 B1* | 12/2015 | Henry | | H03H 3/04 |
| 9,231,181 B2 | 1/2016 | Thom et al. | | |
| 9,300,029 B2* | 3/2016 | Abraham | | B29C 39/10 |
| 9,465,401 B2 | 10/2016 | Uchaykin | | |
| 9,495,644 B2 | 11/2016 | Chudak et al. | | |
| 10,003,217 B2* | 6/2018 | Kuerschner | | H01F 38/14 |
| 10,148,244 B1* | 12/2018 | Henry | | H03H 9/467 |
| 10,447,239 B2* | 10/2019 | Takahashi | | H03H 9/02992 |
| 10,475,983 B1* | 11/2019 | Rosenblatt | | H10N 60/0884 |
| 10,510,943 B1* | 12/2019 | Topaloglu | | H10N 60/805 |
| 10,535,013 B2* | 1/2020 | Abdo | | H03K 19/195 |
| 10,755,190 B2 | 8/2020 | Tcaciuc et al. | | |
| 10,897,068 B2* | 1/2021 | Tcaciuc | | H10N 69/00 |
| 10,938,346 B2 | 3/2021 | Berkley et al. | | |
| 10,958,274 B2* | 3/2021 | Najafi-Yazdi | | H03K 19/1952 |
| 11,038,614 B2* | 6/2021 | Koopferstock | | H04J 14/0205 |
| 11,105,866 B2* | 8/2021 | Swenson | | G01R 33/0094 |
| 11,127,893 B2* | 9/2021 | Johnson | | H10N 60/124 |
| 11,197,365 B2* | 12/2021 | Lucero | | H05K 1/0218 |
| 11,206,011 B2* | 12/2021 | Nakazawa | | H03H 9/72 |
| 11,875,222 B1* | 1/2024 | Reagor | | G06N 10/20 |
| 2003/0058520 A1* | 3/2003 | Yu | | G02B 6/29395 359/291 |
| 2005/0007096 A1* | 1/2005 | Dimino | | G05B 23/0245 324/142 |
| 2005/0082519 A1* | 4/2005 | Amin | | B82Y 10/00 257/13 |
| 2005/0104683 A1* | 5/2005 | Cortes | | H03H 2/00 333/99 S |
| 2005/0184829 A1* | 8/2005 | Yoshimoto | | H03H 3/00 333/185 |
| 2006/0147154 A1* | 7/2006 | Thom | | H10N 60/12 385/37 |
| 2006/0225165 A1* | 10/2006 | Maassen van den Brink | | H04L 67/12 706/14 |
| 2007/0052441 A1* | 3/2007 | Taguchi | | H03K 12/00 326/3 |
| 2008/0176750 A1* | 7/2008 | Rose | | B82Y 10/00 505/170 |
| 2008/0176751 A1* | 7/2008 | Tcaciuc | | H01P 1/2056 333/182 |
| 2008/0215850 A1* | 9/2008 | Berkley | | G06N 10/80 712/1 |
| 2008/0238531 A1* | 10/2008 | Harris | | G06N 10/40 327/528 |
| 2008/0258849 A1* | 10/2008 | Keefe | | H01P 1/202 333/99 S |
| 2008/0284545 A1* | 11/2008 | Keefe | | H01P 3/085 333/204 |
| 2009/0075825 A1* | 3/2009 | Rose | | H04L 45/306 505/170 |
| 2009/0082209 A1* | 3/2009 | Bunyk | | H03M 1/66 341/145 |
| 2009/0102580 A1* | 4/2009 | Uchaykin | | H05K 1/0224 333/185 |
| 2009/0122508 A1* | 5/2009 | Uchaykin | | H05K 9/0077 361/818 |
| 2009/0146599 A1* | 6/2009 | Zhou | | G01R 31/343 318/490 |
| 2009/0168286 A1* | 7/2009 | Berkley | | G01R 33/0354 361/141 |
| 2009/0206871 A1* | 8/2009 | Baumgardner | | B82Y 10/00 326/3 |
| 2010/0157522 A1* | 6/2010 | Refai-Ahmed | | G06F 1/20 361/679.54 |
| 2010/0157552 A1* | 6/2010 | Thom | | H01F 41/048 336/200 |
| 2011/0022820 A1* | 1/2011 | Bunyk | | G06F 15/82 712/1 |
| 2011/0094838 A1* | 4/2011 | Haack | | F16D 51/20 188/325 |
| 2011/0152104 A1* | 6/2011 | Farinelli | | H03H 1/00 505/433 |
| 2011/0175061 A1* | 7/2011 | Berkley | | H01L 23/53285 505/190 |
| 2011/0183853 A1* | 7/2011 | Thom | | H01P 1/202 174/126.1 |
| 2012/0088675 A1* | 4/2012 | Pires | | H01P 1/202 333/206 |
| 2012/0094838 A1 | 4/2012 | Bunyk et al. | | |
| 2012/0135867 A1* | 5/2012 | Thom | | H01P 1/202 333/167 |
| 2014/0137571 A1* | 5/2014 | Petroff | | B01D 8/00 62/55.5 |
| 2014/0326001 A1* | 11/2014 | Citver | | B01D 8/00 62/55.5 |
| 2015/0032994 A1* | 1/2015 | Chudak | | B82Y 10/00 712/42 |
| 2015/0263260 A1 | 9/2015 | Thom et al. | | |
| 2015/0276827 A1* | 10/2015 | Sharma | | H02H 3/253 702/60 |
| 2016/0064128 A1* | 3/2016 | Kummeth | | H10N 60/355 505/211 |
| 2016/0112031 A1* | 4/2016 | Abraham | | H03K 19/1954 327/528 |
| 2016/0121203 A1* | 5/2016 | Gomez | | A63F 7/3075 273/118 A |
| 2016/0267032 A1* | 9/2016 | Rigetti | | G06N 10/40 |
| 2017/0146579 A1* | 5/2017 | Beaty | | H05F 3/04 |
| 2017/0162778 A1 | 6/2017 | Harris et al. | | |
| 2017/0178018 A1* | 6/2017 | Tcaciuc | | H01F 41/076 |
| 2017/0269146 A1* | 9/2017 | Regau | | H05B 45/58 |
| 2017/0373044 A1* | 12/2017 | Das | | H01L 23/53285 |
| 2018/0145631 A1* | 5/2018 | Berkley | | G06N 10/20 |
| 2018/0171430 A1* | 6/2018 | Yoshino | | C22C 38/48 |
| 2018/0265951 A1* | 9/2018 | Yoshino | | C21D 8/0273 |
| 2018/0269556 A1* | 9/2018 | Kim | | H04B 1/40 |
| 2018/0321339 A1* | 11/2018 | Yang | | G01R 33/3614 |
| 2018/0336299 A1* | 11/2018 | Barzegar | | G06N 10/20 |
| 2019/0149130 A1* | 5/2019 | Tani | | H03H 9/6403 370/343 |
| 2019/0393861 A1* | 12/2019 | Nosaka | | H03H 9/72 |
| 2020/0068722 A1* | 2/2020 | Neufeld | | H05K 3/429 |
| 2020/0075833 A1* | 3/2020 | Topaloglu | | B82Y 10/00 |
| 2020/0092985 A1* | 3/2020 | Bruce | | H05K 1/0298 |
| 2020/0310908 A1* | 10/2020 | Hogaboam | | G06F 11/10 |
| 2020/0351007 A1* | 11/2020 | Raymer | | H04J 14/07 |
| 2020/0401923 A1* | 12/2020 | Javadiabhari | | H03M 1/662 |
| 2021/0232364 A1* | 7/2021 | Swenson | | G06N 10/60 |
| 2021/0248506 A1* | 8/2021 | Hoskinson | | H10N 60/12 |
| 2021/0250111 A1* | 8/2021 | Mori | | H03H 7/463 |
| 2021/0336409 A1* | 10/2021 | Nikolov | | H01S 3/04 |
| 2022/0215281 A1* | 7/2022 | Englund | | G06N 10/40 |
| 2023/0142878 A1* | 5/2023 | Yamaji | | H10N 60/12 324/248 |

FOREIGN PATENT DOCUMENTS

| | | |
|---|---|---|
| CN | 1470883 A | 1/2004 |
| CN | 101088102 A | 12/2007 |
| CN | 107580752 A | 1/2018 |
| CN | 107924982 A | 4/2018 |
| CN | 109088135 A | 12/2018 |
| CN | 111326836 B | 7/2021 |

(56) References Cited

FOREIGN PATENT DOCUMENTS

| | | |
|---|---|---|
| DE | 1927825 A1 | 12/1970 |
| DE | 4119880 A1 | 1/1993 |
| EP | 0148479 A2 | 7/1985 |
| EP | 0707349 A1 | 4/1996 |
| EP | 1622435 A1 | 2/2006 |
| JP | 2002374107 A | 12/2002 |
| JP | 2005216999 A | 8/2005 |
| JP | 2007074120 A | 3/2007 |
| JP | 2016538809 A | 12/2016 |
| KR | 20070109989 A | 11/2007 |
| WO | 9609654 A1 | 3/1996 |
| WO | 01-08250 | 2/2001 |
| WO | 2006043879 A1 | 4/2006 |
| WO | 2009120638 A2 | 10/2009 |
| WO | 2010028183 A2 | 3/2010 |
| WO | 2013190263 A1 | 12/2013 |
| WO | 2016183213 A1 | 11/2016 |
| WO | 2017074386 A1 | 5/2017 |
| WO | 2017115008 A1 | 7/2017 |
| WO | 2017192733 A2 | 11/2017 |
| WO | 2018106942 A1 | 6/2018 |

OTHER PUBLICATIONS

Danilin, et al., "Engineering the microwave to infrared noise photon flux for superconducting quantum\ systems", EPJ Quantum Technology, (2022) 9:1, 22 pages.
Douglas, "Magnetic Field Dependence of the Superconducting Energy Gap", Physical Review Letters 6(7): 346-348, Apr. 1, 1961.
Fang, et al., "Development of Hardware for Scaling Up Superconducting Qubits and Simulation of Quantum Chaos", University of California, Santa Barbara, Bachelor's Honors Thesis,, Jun. 12, 2015, 56 pages.
Il'ichev, et al., "Continuous Monitoring of Rabi Oscillations in a Josephson Flux Qubit," arXiv:cond-mat/0303433v1, Mar. 20, 2003.
Johnson, et al., "Scalable Control System for a Superconducting Adiabatic Quantum Optimization Processor," ArXiv:0907.3757v1. Jul. 22, 2009. [online] Available. chrome-extension://efaidnbmnnnibpcajpcglclefindmkaj/https://arxiv.org/pdf/0907.3757v1.pdf.
Likharev, et al., "RSFQ logic/memory family: a new Josephson-junction technology for sub-terahertz-clock-frequency digital systems"; IEEE Transactions on Applied Superconductivity; vol. 1, No. 1; Mar. 1991.
Makhlin, et al., "Quantum-state engineering with Josephson-junction devices," arXIv:cond-mat/0011269v1, Nov. 15, 2000 Reviews of Modern Physics 73(2):357-400, Apr. 2001.
Milliken, et al. "50 Ω characteristic impedance low-pass metal powder filters," Review of Scientific Instruments 78(2):024701, 2007, 5 pages.
Norris, "Improving Infrared-Blocking Microwave Filters", Semester Report, Oct. 2, 2017, 114 pages.
Swenson, et al., "A Broad Superconducting SQUID Switch", Aug. 23, 2016.
Swenson, "Isolating the D-Wave Quantum Processor from Thermal Photons above vc=kb0.003/h=62.5 Mhz", 2016.
Williams, "Explorations in Quantum Computing", Chapter 11, "How to Make a Quantum Computer," pp. 241-265, 1998.
Beev, et al., "Cryogenic time-domain multiplexer based on SQUID arrays and superconducting/normal conducting switches", Journal of Physics: Conference Series 507 (2014) 042003, 5 pages.
Prele, et al., "Nondissipative Addressing for Time-Division SQUID Multiplexing", IEEE Transactions on Applied Superconductivity, Dec. 2011,5 pages.
Berkley, "A Josephson Junction Qubit", Dissertation University of Maryland, 2003.
Bladh et al., "Comparison of Cryogenic Filters for use in Single Electronics Experiments," Review of Scientific Instruments 74(3):1323-1327, 2003.

Bordier et al., "Superconducting Coplanar Switch and Phase Shifter for CMB Applications," J Low Temp Phys, 2016, 7 pages.
Brennen et al., "Why should anyone care about computing with anyons?," arXiv:0704.2241v1 [quant-ph], pp. 1-12, Apr. 18, 2007.
Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.
Bunyk et al., "RSFQ Technology: Physics and Devices", World Scientific International Journal of High Speed Electronics and Systems, vol. 11, No. 01, pp. 257-305 (2001).
Chapman et al., "General Purpose Multiplexing Device for Cryogenic Microwave Systems," arXiv:1603.02716v2 [quant-ph] May 31, 2016, 10 pages.
Chapman et al., "Widely Tunable On-Chip Microwave Circulator for Superconducting Quantum Circuits," Physical Review, vol. 7. 2017, 16 pages.
Chapman, et al. "Design of an On-Chip Superconducting Microwave Circulator with Octave Bandwidth" Phys. Rev. Applied 11, 044048—Published Apr. 16, 2019, 13 pages.
Chinese Office Action dated Jul. 22, 2021 for Chinese Application No. 201980047690.7 in 8 pages.
J. Aumentado, 2020, IEEE Microwave Magazine 20(4), Dec. 2020, 18 pages.
Kerckhoff, et al., "On-Chip Superconducting Microwave Circulator from Synthetic Rotation", Phys. Rev. Applied 4, 034002—Published Sep. 10, 2015, 15 pages.
Final Office Action Issued in U.S. Appl. No. 16/562,984, mailed Jan. 31, 2023, 18 pages.
Notice of Allowance for U.S. Appl. No. 17/388,545, mailed Sep. 27, 2022, 9 pages.
Dickson et al., "Thermally Assisted Quantum Annealing of a 16-Qubit Problem," Nature Communications, 2013, 6 pages.
Farhi et al., "Quantum Adiabatic Evolution Algorithms versus Simulated Annealing," MIT-CTP #3228, arXiv:quant-ph/0201031 v1, pp. 1-16, Jan. 8, 2002.
Friedman et al., "Quantum superposition of distinct macroscopic states," Nature 406:43-46, Jul. 6, 2000.
Fukushima, A. et al., "Attenuation of Microwave Filters for Single-Electron Tunneling Experiments," IEEE Transactions on Instrumentation and Measurement, 46(2):289-293, 1997.
Harris et al., "Sign and Magnitude Tunable Coupler for Superconducting Flux Qubits," arXiv:cond-mat/0608253v1 [cond-mat.supr-con], Aug. 11, 2006. 5 pages.
Il'ichev et al., "Continuous Monitoring of Rabi Oscillations in a Josephson Flux Qubit," Physical Review Letters 91(9): 097906-1-097906-4, week ending Aug. 29, 2003.
International Search Report and Written Opinion for PCT/US2019/032689 mailed Sep. 16, 2019, 13 pages.
Jin et al., "Distributed microwave damping filters for superconducting quantum interference devices", Appl. Phys. Lett. 70(16):2186-2188, Apr. 21, 1997.
Johnson et al., "Scalable Control System for a Superconducting Adiabatic Quantum Optimization Processor," Superconductor Science & Technology (2010).
Jones et al., "Highly Controllable Qubit-Bath Coupling Based on a Sequence of Resonators," arXiv:1304.4829v2 [cond-mat.mes-hall] Sep. 27, 2013, 11 pages.
Jones et al., "Tunable electromagnetic Environment for Superconducting Quantum Bits," arXiv:1320.3824v5 [cond-mat.mes-hall] Jun. 13, 2013, 11 pages.
Lee et al., "Investigation of the Dependences of the Attenuation Properties of Cryogenic Metal-Powder Filters on the Preparation Method", Springer, Apr. 18, 2018.
Lee et al., "Study on the fabrication of low-pass metal powder filters for use at cryogenic temperatures", Springer, Aug. 18, 2016.
Likharev et al., "Reversible Conveyer Computation in Array of Parametric Quantrons," IEEE Transactions on Magnetics MAG—21(2):947-950, 1985.
Likharev, "Classical and Quantum Limitations on Energy Consumption in Computation," International Journal of Theoretical Physics 21(3/4):311-326, 1982.

(56) References Cited

OTHER PUBLICATIONS

Likharev, "Dynamics of Some Single Flux Quantum Devices: I. Parametric Quatron," IEEE Transactions on Magnetics MAG—3(1):242-244, 1977.
Lukashenko et al., "Improved powder filters for qubit measurements", Review of Scientific Instruments 79(014701):1-4, 2001.
Makhlin et al., "Quantum-state engineering with Josephson-junction devices," Reviews of Modern Physics 73(2):357-400, Apr. 2001.
Milliken, F.P. et al., "50 Ω Characteristic Impedance Low-Pass Metal Powder Filters," Review of Scientific Instruments vol. 78, 2007, 6 pages.
Mizugaki et al., "Single-flux-quantum pump based on a three-junction superconducting quantum interference device", Applied Physics Letters, vol. 80(24), Jun. 17, 2002, 3 pages.
Mooij et al., "Josephson Persistent-Current Qubit," Science 285:1036-1039, Aug. 13, 1999.
Mueller, et al., "Printed Circuit Board Metal Powder Filters for Low Electron Temperatures", ArXiv:1304.3306, Apr. 11, 2013, 13 pages.
Naaman et al., "On-Chip Josephson Junction Microwave Switch," Northrop Grumman Systems Corp., Baltimore, Maryland, USA, Dec. 7, 2015, 10 pages.
Naaman, O. et al., "On-Chip Josephson Junction Microwave Switch," arXiv:1512.01484v1 [cond-mat.supr-con] Dec. 4, 2015, 10 pages.
Nielsen et al., Quantum Computation and Quantum Information, Cambridge University Press, Cambridge, 2000, "7.8 Other implementation schemes," pp. 343-345.
Nielsen, "Cluster-State Quantum Computation," arXiv:quant-ph/0504097v2, pp. 1-15, Jul. 1, 2005.
Orlando et al., "Superconducting persistent-current qubit," Physical Review B 60(22):15398-15413, Dec. 1, 1999.
Partanen et al., "Flux-tunable heat sink for quantum electric circuits", ArXiv:1712.10256, Dec. 29, 2017.
Pechal et al., "Superconducting Switch for Fast On-Chip Routing of Quantum Microwave Fields," arXiv:1606.01031v1 [quant-ph] Jun. 3, 2016, 8 pages.
Poulin et al., "A Superconducting Microwave Switch," IEEE Transactions on Applied Superconductivity 5(2):3046-3048, 1995.
Powell et al., "Thermal Conductivity of Metals and Alloys at Low Temperatures", National Bureau of Standards Circular 556, Sep. 1, 1954.
Santavicca et al., "Impedance-Matched Low-Pass Stripline Filters," arXiv:0802.1343 [physics.ins-det] 2008, 9 pages.
Shabani et al., "Artificial Quantum Thermal Bath: Engineering Temperature for a Many-Body Quantum System," arXiv:1510.04354v2 [quant-ph] Nov. 4, 2016, 10 pages.
Shor, "Introduction to Quantum Algorithms," AT&T Labs—Research, arXiv:quant-ph/0005003 v2, pp. 1-17, Jul. 6, 2001.
Tuorila et al., "Efficient Protocol for Qubit Initialization with a Tunable Environment," arXiv:1612.04160v1 [cond-mat.mes-hall] Dec. 13, 2016, 17 pages.
Watanabe et al., "Resonance-Free Low-Pass Filters for the AC Josephson Voltage Standard," IEEE Transactions on Applied Superconductivity 16(1):49-53, 2006.
Williams, "Explorations in Quantum Computing", Springer, New York, Dec. 12, 1997, Chapter 11, "How to Make a Quantum Computer," pp. 241-265.
Wollack et al., "Impedance Matched Absorptive Thermal Blocking Filters," arXiv:1403.2909v1 [astro-ph.IM] Mar. 12, 2014, 5 pages.
X. Ning, "The development status and practical application prospects of superconducting technology" China Academia Journal Electronic Publishing House, HttP>//www.cnki.net, Application 2003, 3 pages.
Yeap, K.H. et al., "Attenuation in Superconducting Circular Waveguides," Advanced Electromagnetics vol. 5, No. 2, Sep. 2016, 5 pages.
Zorin, "The thermocoax cable as the microwave frequency filter for single electron circuits", Rev. Sci. Instrum. 66(8):4296-4300, Aug. 1995.
Non-Final Office Action mailed Jul. 28, 2022 in U.S. Appl. No. 16/562,984 (17 pages).
Blais et al., Cavity Quantum Electrodynamics for Superconducting Electrical Circuits: An Architecture for Quantum Computation, Physical Review A 69(062320):1-14, 2004.
Bronn, et al., "Broadband Filters for Abatement of Spontaneous Emission in Circuit Quantum Electrodynamics", arXiv:1508.01743v2 [quant-ph] Oct. 29, 2015.
Cleland, et al., "Mechanical Purcell Filters for Microwave Quantum Machines", arXiv:1905.08403v1 [quant-ph] May 21, 2019.
Ethier-Majcher, et al. , "A tunable Purcell filter design for multiplexed qubit readout", APS Marching 2019, Abstract id, R35.005, 1 page.
Heinsoo, J. et al., "Rapid high-fidelity multiplexed readout of superconducting qubits," arXiv:1801.07904v1 [quant-ph], Jan. 24, 2018, 13 pages.
Houck, et al., "Controlling the Spontaneous Emission of a Superconducting Transmon Qubit", Physical Review Letters, PRL, 101, 080502, Aug. 22, 2008.
Huang, "High Q Tunable Filters", Thesis, 2012, 161 pages.
International Search Report and Written Opinion for PCT/US2023/068780 dated Oct. 10, 2023 in 9 pages.
Johnson, "Controlling Photons in Superconducting Electrical Circuits", Yale University in Candidacy for the Degree of Doctor Of Philosophy, May 2011, 190 pages.
Johnson, et al., "Fast Reset and Suppressing Spontaneous Emission of a Superconducting Qubit", arXiv:1003.0142v1 [cond-mat.meshall] Feb. 28, 2010, 4 pages.
Krantz et al., "A quantum engineer's guide to superconducting qubits", Appl. Phys. Rev. 6, 021318 (2019), Jun. 20, 2019.
Microwaves101, "Lumped Elements Filters", The World's Microwave Information Resource since 2001, 8 pages.
Mutus, et al., "Design and characterization of a lumped element single-ended superconducting microwave parametric amplifier with on-chip flux bias", arXiv:1308.1376v3 [cond-mat.supr-con] Oct. 3, 2013, 5 pages.
Notice of Allowance for U.S. Appl. No. 18/082,385, mailed Aug. 10, 2023, 9 pages.
Reed, et al, "Fast reset and suppressing spontaneous emission of a superconducting qubit", Appl. Phys. Lett. 96, 203110 (2010) 4 pages.
Sank, "Fast, Accurate State Measurement in Superconducting Qubits", Doctor of Philosophy in Physics, 229 pages.
Sete, et al., "Quantum theory of a bandpass Purcell filter for qubit readout", Physical Review A 92, 012325 (2015) 13 pages.
Wallraff, et al., "Approaching Unit Visibility for Control of a Superconducting Qubit with Dispersive Readout", Physical Review Letters, PRL. 95, 060501 (2005), Aug. 5, 2005, 4 pages.
Bronn , et al., "Reducing Spontaneous Emission in Circuit Quantum electrodynamics by a Combined Readout/Filter Technique", arXiv:1504.04353 [quant-ph], 2015, 9 pages.

* cited by examiner

SYSTEMS AND METHODS FOR VARIABLE BANDWIDTH ANNEALING

FIELD

This disclosure generally relates to selecting annealing bandwidth for quantum processors.

BACKGROUND

Quantum Computation

A quantum computer is a system that makes direct use of at least one quantum-mechanical phenomenon, such as, superposition, tunneling, and entanglement, to perform operations on data. A single unit of quantum information is a qubit. Quantum computers are physical systems that realize and allow for the manipulation of qubits. Quantum computers can provide speedup for certain classes of computational problems such as computational problems simulating quantum physics.

Quantum Annealing

Quantum annealing is a computational method that may be used to find a low-energy state of a system, typically preferably the ground state of the system. The method relies on the underlying principle that natural systems tend towards lower energy states because lower energy states are more stable. Quantum annealing may use quantum effects, such as quantum tunneling, as a source of delocalization to reach an energy minimum.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

A filter multiplexer system for annealing bandwidth selection or setting or configuration is described. The filter multiplexer comprises at least one external annealing line; a plurality of filters communicatively coupled to the at least one external annealing line, each filter of the plurality of filters having a different cutoff frequency; and a multiplexer, the multiplexer having an output line and a plurality of input lines, each input line in the plurality of input lines communicatively coupled to one filter in the plurality of filters, and a plurality of pathways, each pathway comprising at least one switch. The at least one switch may be a superconducting switch. The at least one superconducting switch may be a cryotron. The system may further comprise a plurality of external annealing lines, each external annealing line communicatively coupled to a respective one filter in the plurality of filters. The system may further comprise the output line of the multiplexer communicatively coupled to at least one on-chip annealing line, the on-chip annealing line communicatively coupled to qubits of a quantum processor. The system may further comprise a demultiplexer, the demultiplexer having one input line, communicatively coupled to the at least one external annealing line, and a plurality of output lines, each output line in the plurality of output lines communicatively coupled to one filter in the plurality of filters, the demultiplexer comprising a plurality of pathways, each pathway comprising at least one switch. The at least one switch in each pathway may be a superconducting switch. The at least one superconducting switch may be a cryotron.

A system for variable annealing bandwidth selection is described. The system comprises: a quantum annealing processor, the quantum annealing processor comprising a plurality of qubits and couplers, and a set of on-chip annealing lines, the on-chip annealing lines communicatively coupled to the plurality of qubits; at least one external annealing line; a plurality of filters communicatively coupled to the at least one external annealing line, each filter of the plurality of filters having a different cutoff frequency; and a multiplexer, the multiplexer having an output line and a plurality of input lines, each input line in the plurality of input lines communicatively coupled to the at least one filter in the plurality of filters, and a plurality of pathways, each pathway comprising at least one switch. The quantum annealing processor, the plurality of filters and the multiplexer may be housed at a same temperature as one another. The at least one switch in each pathway may be a superconducting switch. The at least one superconducting switch may be a cryotron. The system may further comprise a plurality of external annealing lines, each external annealing line communicatively coupled to a respective one filter in the plurality of filters. The system may further comprise the output line of the multiplexer communicatively coupled to at least one on-chip annealing line of the set of on-chip annealing lines. The system may further comprise a demultiplexer, the demultiplexer having one input line, communicatively coupled to the at least one external annealing line, and a plurality of output lines, each output line in the plurality of output lines communicatively coupled to a respective one filter in the plurality of filters, the demultiplexer comprising a plurality of pathways, each pathway comprising at least one switch. The at least one switch in each pathway may be a superconducting switch. The at least one superconducting switch may be a cryotron.

A system for continuously tunable variable annealing bandwidth selection is described. The system comprises: a quantum annealing processor, the quantum annealing processor comprising a plurality of qubits and couplers, and a set of on-chip annealing lines, the on-chip annealing lines communicatively coupled to the plurality of qubits; at least one external annealing line; and a tunable filter having an input line and an output line, the input line of the tunable filter communicatively coupled to the at least one external annealing line and the output line of the tunable filter communicatively coupled to the quantum annealing processor, the tunable filter comprising a plurality of cascade elements communicatively coupled in series, each cascade element of the plurality of cascade elements comprising: a respective first plurality of N Superconducting Quantum Interference Devices (SQUIDs) communicatively coupled in series in a first arm, each SQUID of the first plurality of SQUIDs comprising at least one Josephson Junction; a respective matching capacitor; and a respective second plurality of M SQUIDs communicatively coupled in series in a second arm, opposite the first arm with respect to the matching capacitor, each SQUID of the second plurality of SQUIDs comprising at least one Josephson Junction.

A method for variable bandwidth annealing in a quantum annealing processor system comprising a quantum annealing processor, the quantum annealing processor comprising a plurality of qubits, and a set of on-chip annealing lines, the on-chip annealing lines communicatively coupled to the plurality of qubits; at least one external annealing line; a plurality of filters communicatively coupled to the at least one external annealing line, at least two of the plurality of filters having a different cutoff frequency from one another; and a multiplexer, the multiplexer having an output line and a plurality of input lines, the output line of the multiplexer communicatively coupled to the on-chip annealing lines, each input line in the plurality of input lines communicatively coupled to the at least one filter in the plurality of filters, and a plurality of pathways, each pathway comprising at least one switch, the multiplexer able to provide a plurality of annealing bandwidth settings is described. The method comprises: setting an annealing bandwidth setting via the multiplexer; and causing the quantum processor to evolve according to the annealing bandwidth setting. The method may further comprise receiving an input problem, the input problem having a desired annealing schedule; and wherein setting an annealing bandwidth setting to obtain the desired annealing schedule occurs before causing the quantum processor to evolve according to the selected annealing bandwidth setting.

A method for calibrating a quantum annealing processor system comprising a quantum annealing processor, the quantum annealing processor comprising a plurality of qubits, and a set of on-chip annealing lines, the on-chip annealing lines communicatively coupled to the plurality of qubits; at least one external annealing line; a plurality of filters communicatively coupled to the at least one external annealing line, each filter of the plurality of filters having a different cutoff frequency from one another; and a multiplexer, the multiplexer having an output line and a plurality of input lines, the output line of the multiplexer communicatively coupled to the on-chip annealing lines, each input line in the plurality of input lines communicatively coupled to the at least one filter in the plurality of filters, and a plurality of pathways, each pathway comprising at least one switch, the multiplexer able to provide a plurality of annealing bandwidth settings is described. The method comprises: setting a large annealing bandwidth setting via the multiplexer; and performing a calibration of the quantum processor while causing the quantum processor to evolve according to the large annealing bandwidth setting. The method may further comprise iteratively, until all available annealing bandwidth settings have been set, selecting an $i^{th}$ annealing bandwidth setting via the multiplexer; and performing a calibration of the quantum processor while causing the quantum processor to evolve according to the $i^{th}$ annealing bandwidth setting.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The Abstract of the Disclosure provided herein is for convenience only and does not interpret the scope or meaning of the implementations.

Quantum computers may be analog systems. In order to achieve good performance, a calibration is desirable. This calibration may assess, for example, all the analog values relevant to qubits, couplers, and control devices. This includes, for example, the qubit inductance, capacitance, junction critical currents, and/or digital-to-analog (DAC) storage inductances. While in principle a full system behavior could be fit to a complex model for the purpose of calibration, this quickly becomes an intractable problem as the processor size, and, consequently, the device number and connectivity between devices, is increased. As such, calibration procedures generally may rely on single- and two-qubit measurements for much of the calibration. Once this has been assessed, larger fine-tuning can be achieved by calibrating larger objects such as, for example, 4-qubit chains.

In quantum annealing processors, the single- and two-qubit measurements may be realized with a set of annealing lines. In some implementations, the set of annealing lines includes several CJJ analog lines (analog lines to bias compound Josephson junctions) and an IP actuator line (a line providing a critical current Ip to qubits). The IP actuator line may be globally shared by all qubits in a quantum processor, whereas the number and wiring of the CJJ lines may be chosen such as to allow individual qubits to be annealed while keeping all connected qubits in a quiescent state. This enables single- and two-qubit measurements to be performed in a locally stable environment.

When determining the appropriate bandwidth for these annealing lines it is desirable to consider all advantages and disadvantages of different bandwidths. In some cases, it may be more advantageous to use a large bandwidth, for example in cases where a faster calibration is desirable. The spectral gap of a one and two qubit systems is relatively large, thus Landau-Zener transitions are only observed at the fastest annealing rates. This allows large bandwidths to be utilized, which integrates less noise during one- and two-qubit measurements. For example, the measurement of the transition width of a single qubit has been observed to decrease with decreased annealing time. Measurements such as this are widely used for processor calibration, thus improvements in speed and accuracy can reduce the total calibration time of a quantum annealing processor.

However, the same annealing lines may also be used for problem solving by quantum annealing. For large-scale problems with a small spectral gap, a long anneal time may result in greater success probability and is, therefore, desirable. In particular, slow annealing will result in fewer transitions to excited states of the system. Large bandwidth lines will introduce greater fluctuations throughout the annealing sequence; thus, small bandwidth lines would seem to be preferred for problem solving.

A possible approach is to compromise between the ideal bandwidth for calibration and the optimal bandwidth for solving hard problems. For example, an annealing line with a fixed 3 MHz bandwidth may be used. This relatively low bandwidth allows annealing as fast as a few hundred nanoseconds. However, for calibration and diagnostic purposes, a faster annealing is desirable, for example using a 30 MHz bandwidth. A 30 MHz bandwidth (corresponding to a fast anneal time) may be used for measurement of easy problems. For hard problems that exhibit a small spectral gap an optimal anneal time may be greater than 1 microsecond. In this case, annealing lines with less than 1 MHz bandwidth would be preferred in order to improve annealing performance. Potentially, bandwidths as low as 1 Hz or lower may be useful, in some cases. This suggests slower annealing may be advantageous to leverage the benefits of quantum dynamics while annealing.

While a greater bandwidth allows faster annealing times to be accessed, this greater dynamic range in the annealing schedule also presents disadvantages. The increased bandwidth introduces greater current fluctuations on the annealing lines. For example, going from a 3 MHz to 30 MHz filter cutoff frequency increases current noise by ~3× for a 10× increase in bandwidth as $$I_n = \left(\frac{4k_b T \Delta f}{R}\right)^{1/2},$$

where $I_n$ is the current noise, $\Delta f$ is the bandwidth, and $k_B$ is Boltzmann constant, assuming the same physical temperature T and resistance R of the electronics output. The annealing line currents are used to drive the CJJ (compound Josephson junction) loop of a CCJJ (compound-compound Josephson junction) qubit and the increased current noise may result in a 3× increase in noise. If the qubits were in a very low noise environment and the noise was dominated by fluctuations in the control signal, additional noise due to an increased bandwidth could potentially result in a decrease in processor performance.

For quantum annealing processors that are susceptible to noise, the desirable bandwidth for the annealing lines is, therefore, problem dependent. For example, for measurements with large spectral gaps, such as one- and two-qubit systems, a large bandwidth is desirable. However, for problems which exhibit a small spectral gap (i.e., hard problems), the optimal annealing time may be longer. In this case, a small bandwidth is preferred. Given that annealing line bandwidth is problem dependent, it is advantageous to allow for annealing line bandwidth to be tuned in-situ.

The present disclosure describes systems and methods for selecting or setting in-situ a desired annealing bandwidth in a quantum annealing processor by communicatively coupling a series of annealing lines via a multiplexer to on-chip annealing lines. Examples implementations are described in FIGS. 1, 2 and 3. The multiplexer comprises a plurality of pathways where each pathway comprises at least one filter and at least one switch. It is desirable for the annealing line filters and switches to be located at the same temperature as the quantum processor and to exhibit little line heating, to avoid introducing additional blackbody radiation. In one implementation, switches may be located at cryogenic temperature and be nearly lossless. Examples of switches and filters for quantum computation have been disclosed in U.S. Pat. Nos. 8,008,991, 10,097,151, 8,670,809, US Patent Publication No US20170178018A1, US Patent Publication No US20190089031A1, and U.S. patent application Ser. No. 16/397,790 (published as US Patent Application Publication No US20190369171A1).

In at least one implementation, for example where the quantum processor is a superconducting quantum processor, superconducting switches are used in the multiplexer. A superconducting switch potentially suitable to this application is a cryotron. A cryotron switch may be implemented with a central wire of a relatively lower critical magnetic field $H_{\{c,1\}}$ and a solenoid of a wire with a relatively higher critical magnetic field $H_{\{c,2\}}$ as compared to the lower critical magnetic field $H_{\{c,1\}}$. For example, a central wire of Nb with a solenoid made of NbN wire. Nb has a relatively high resistance and high Tc, which allows the switch to be compact. While some heating will occur during switching, the heat generated would be tolerable given the low duty cycle of these switching elements and positioning these switching elements in locations that are not proximate to the quantum processor; thus, not impacting the environment of the quantum processor. Cryotrons may be multiplexed by having multiple NbN wires wrapped in concentric solenoids. Using appropriate currents, it is possible to ensure that all solenoids are activated with the same field polarity to exceed $H_{\{c,1\}}$. As there are two possible winding directions for the solenoid, in principle n select channels can be used to control $2^n$ switches.

Figure 1:
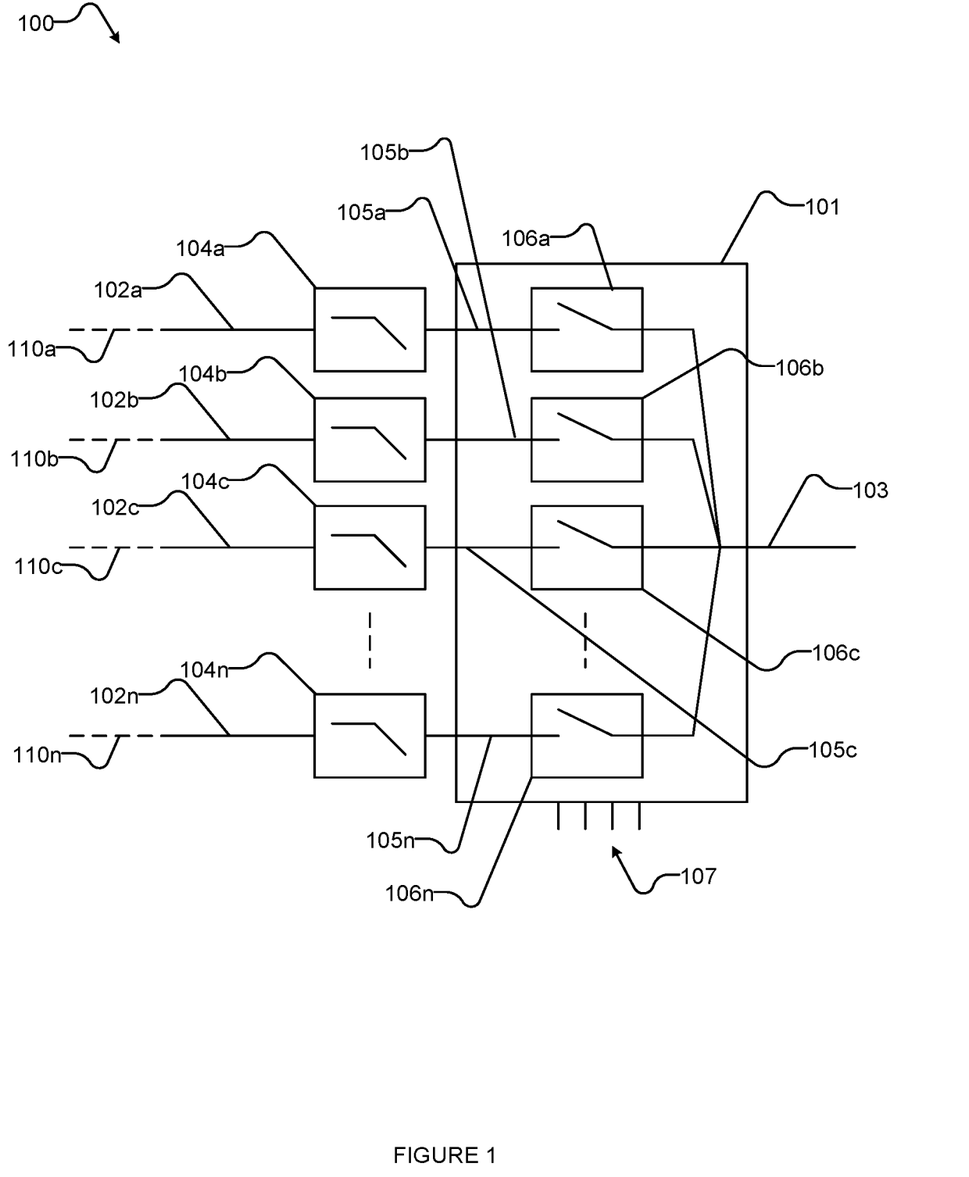
FIG. 1 is a schematic diagram of an example filter multiplexer for annealing bandwidth selection, setting or configuration comprising a plurality of input annealing lines and one output line.

FIG. 1 is a schematic diagram of an example filter multiplexer 100 for annealing bandwidth selection or in-situ setting or configuration of the annealing bandwidth, comprising a plurality of input annealing lines and one output line. Filter multiplexer 100 may be used with a quantum annealing processor, for example a superconducting quantum annealing processor comprising superconducting qubits. Filter multiplexer 100 comprises a multiplexer 101, having input lines 102a through 102n (collectively, 102) and one output line 103. Input lines 102 are communicatively coupled to external annealing lines 110a through 110n (collectively, 110), located outside the isolated environment of a quantum processor. Output line 103 is communicatively coupled to on-chip annealing lines to provide control over annealing qubits of the quantum processor. Filter multiplexer 100 comprises a plurality of filters 104a through 104n (collectively, 104), one per input line 102. Multiplexer 101 comprises n pathways 105a through 105n (collectively, 105), one per input line 102. Multiplexer 101 further comprises a plurality of switches 106a through 106n (collectively, 106), so that each pathway 105 comprises one switch 106. Filters 104 and switches 106 are located at a same temperature as the environment of the quantum processor. It is desirable that filters 104 and switches 106 exhibit low heating to reduce degradation of the environment of the quantum processor. Each filter 104 has a different cutoff frequency to allow for a different annealing bandwidth selection or setting. It is desirable that the relative impedance of every switch 106 is high at all frequencies used for annealing, compared to the on-chip annealing line impedance at the same frequencies. For example, if the processor realizes a characteristic impedance $Z_0$ of approximately 260 Ohms below an annealing frequency of 30 MHz, it is desirable for switches 106 to have impedance of the order of MOhms. Multiplexer 101 also comprises a switch select 107. Switch select 107 is used to select, set or otherwise configure which input line 102 is communicatively coupled to output line 103.

Filter multiplexer 100 allows the output impedance of the external (or room-temperature) electronics to be tailored to individual filters 104. However, filter multiplexer 100 requires a potentially large number of lines to be communicatively coupled to room-temperature electronics; thus, potentially increasing the complexity of the quantum processor cryogenic input/output circuitry and introducing additional noise sources.

Figure 2:
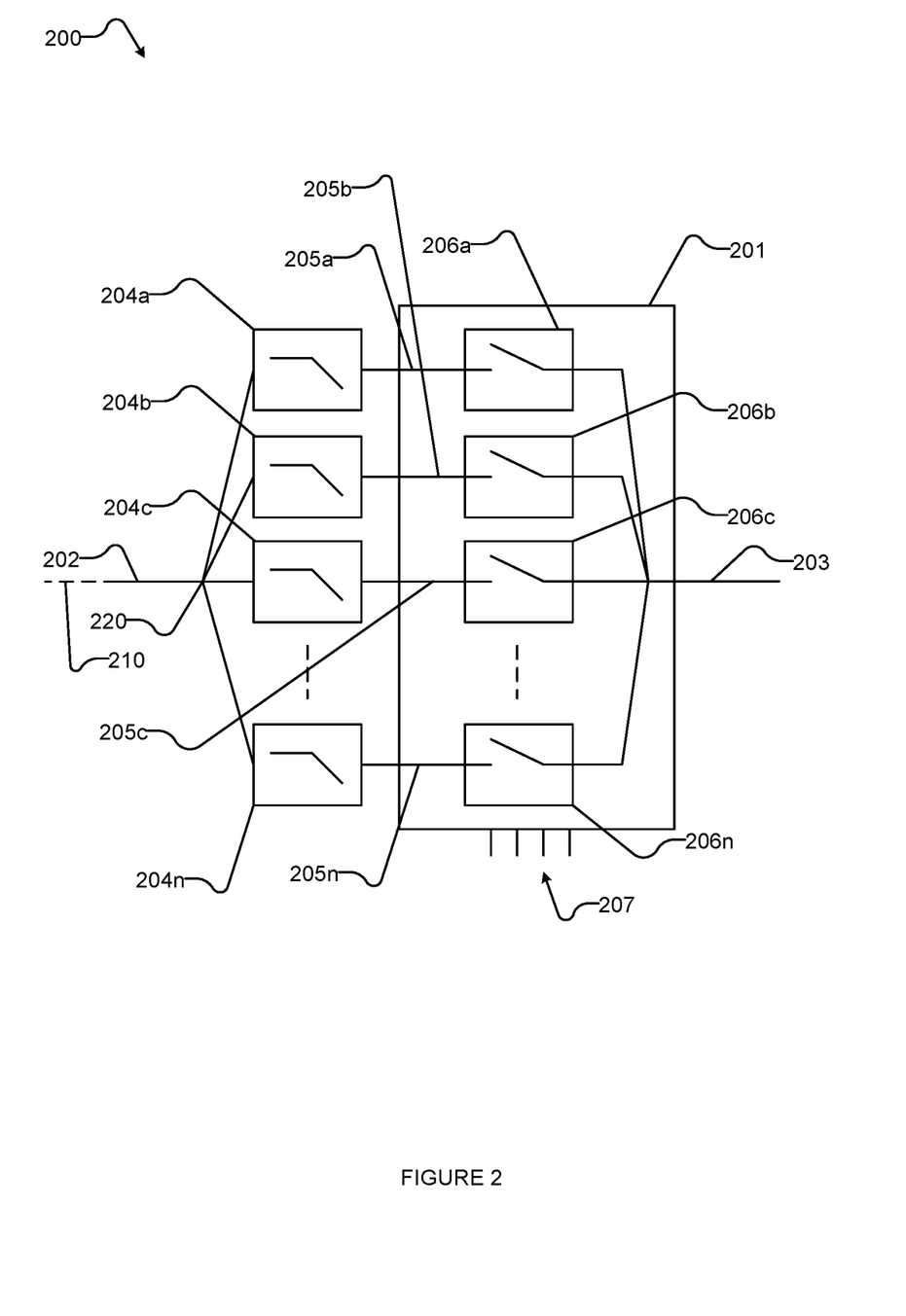
FIG. 2 is a schematic diagram of an example filter multiplexer for annealing bandwidth selection, setting or configuration comprising one input annealing line and one output line.

FIG. 2 is a schematic diagram of an example filter multiplexer 200 for annealing bandwidth selection or in-situ setting or configuration of the annealing bandwidth, comprising one input annealing line and one output line. Filter multiplexer 200 may be used with a quantum annealing processor, for example a superconducting quantum annealing processor comprising superconducting qubits. Filter multiplexer 200 comprises a multiplexer 201, one input line 202 and one output line 203. Input line 202 is communicatively coupled to external annealing line 210, located outside the isolated environment of a quantum processor. Output line 203 is communicatively coupled to on-chip annealing lines to provide control over annealing qubits of the quantum processor. Filter multiplexer 200 comprises a plurality of filters 204a through 204n (collectively, 204) communicatively coupled to input line 202 by a splitter 220. Multiplexer 201 comprises n pathways 205a through 205n (collectively, 205), so each pathway 205 is communicatively coupled to one filter 204. Multiplexer 201 further comprises a plurality of switches 206a through 206n (collectively, 206), so that each pathway 205 comprises one switch 206. Filters 204 and switches 206 are located at a same temperature as the environment of the quantum processor. It is desirable that filters 204 and switches 206 exhibits low heating to reduce degradation of the environment of the quantum processor. Each filter 204 has a different cutoff frequency to allow for a different annealing bandwidth selection. Multiplexer 201 also comprises a switch select 207. Switch select 207 is used to select which pathway 205 is communicatively coupled to output line 203.

Compared to filter multiplexer 100 of FIG. 1, filter multiplexer 200 has a reduced number of lines out of the cryogenic processor environment. However, due to the lack of switches between filters 204 and input line 202, some signal energy from input line 202 may be dissipated in the neighboring filters 204 and reflection may cause signal distortion.

Figure 3:
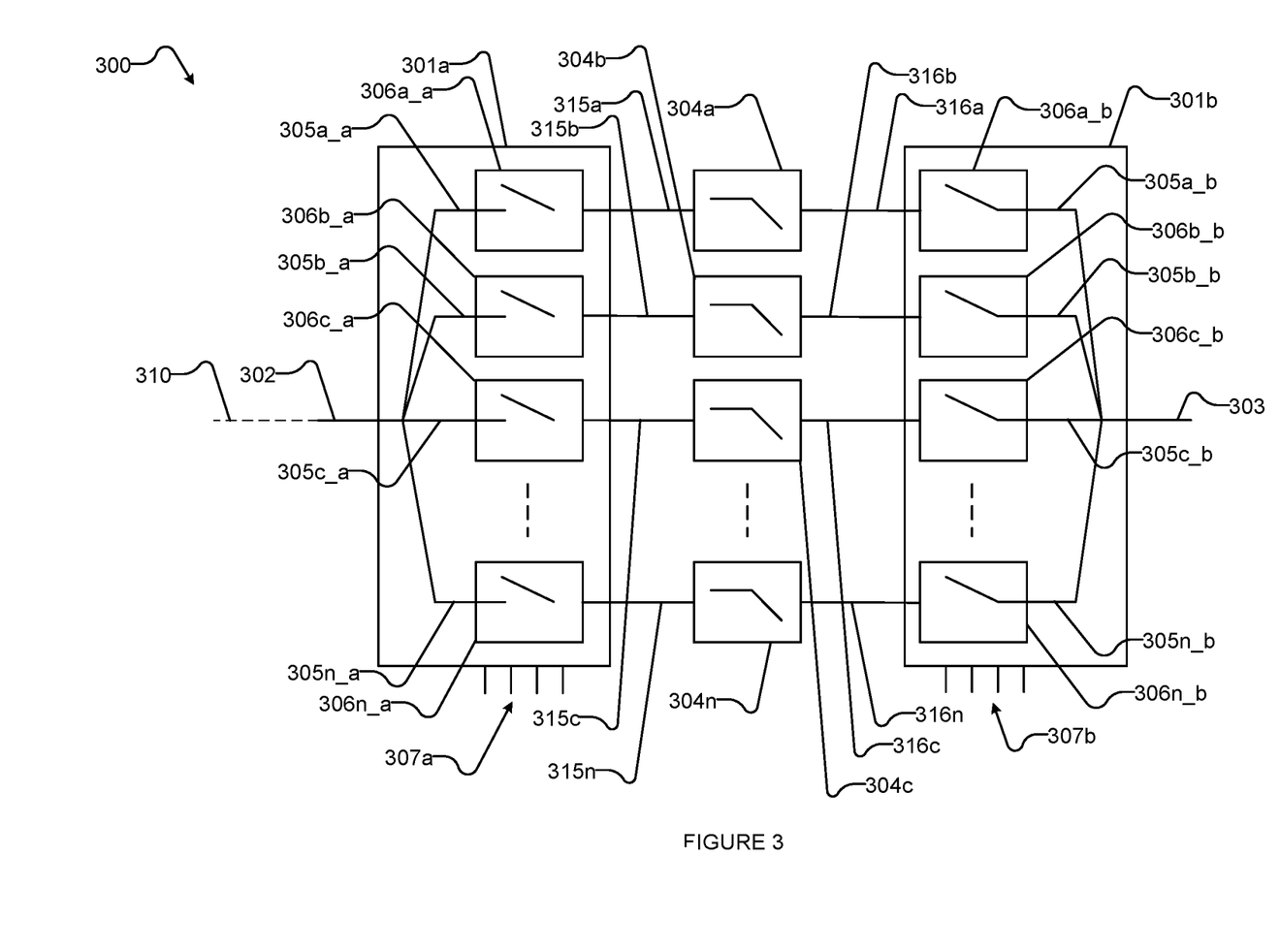
FIG. 3 is a schematic diagram of an example filter multiplexer for annealing bandwidth selection, setting or configuration where each pathway comprises two switches and one filter positioned between the switches.

FIG. 3 is a schematic diagram of an example filter multiplexer 300 for annealing bandwidth selection or in-situ setting or configuration of the annealing bandwidth, where each pathway comprises two switches and one filter positioned between the switches. Filter multiplexer 300 may be used with a quantum annealing processor, for example a superconducting quantum annealing processor comprising superconducting qubits. Filter multiplexer 300 comprises one input line 302 and one output line 303. Input line 302 is communicatively coupled to external annealing line 310, located outside the isolated environment of a quantum processor. Output line 303 is communicatively coupled to on-chip annealing lines to provide control over annealing qubits of the quantum processor. Filter multiplexer 300 comprises a demultiplexer 301a, with input line 302 as input and a plurality of output lines 315a through 315n (collectively, 315).

Filter multiplexer 300 comprises n filters 304a through 304n (collectively, 304), each one of filters 304 communicatively coupled to one of output lines 315 of demultiplexer 301a. Each filter 304 has a different cutoff frequency to allow for a different annealing bandwidth selection, setting or configuration.

Filter multiplexer 300 further comprises a multiplexer 301b, having a plurality of input lines 316a through 316n (collectively 316) and output line 303 as output, so that each one of filters 304 is communicatively coupled to one input line 316.

Demultiplexer 301a comprises n pathways 305a_a through 305n_a (collectively, 305a), where each pathway 305a is communicatively coupled to one output line 315. Demultiplexer 301a further comprises a plurality of switches 306a_a, 306b_a through 306n_a, (collectively, 306a), so that each pathway 305a comprises one switch 306a. Demultiplexer 301a also comprises a switch select 307a. Switch select 307a is used to select, set or otherwise configure which pathway 305a is communicatively coupled to input line 302.

Multiplexer 301b comprises n pathways 305a_b through 305n_b (collectively, 305b), where each pathway 305b is communicatively coupled to one input line 316. Multiplexer 301b further comprises a plurality of switches 306a_b through 306n_b (collectively 306b), so each pathway 305b comprises one switch 306b. Multiplexer 301b also comprises a switch select 307b. Switch select 307b is used to select, set or otherwise configure which pathway 305b is communicatively coupled to output line 303. Switch select 307a and 307b are synchronized to ensure a single annealing bandwidth is realized. For example, if switch select 307a activates pathway 305a_a, then switch select 307b activates pathway 305a_b, so that a signal applied at input line 302 propagates though switch 306a_a, filter 304a and switch 306a_b, before reaching output line 303.

Filters 304 and switches 306a and 306b are located at the same temperature as an environment of the quantum processor. It is desirable that filters 304 and switches 306a and 306b exhibits low heating to reduce degradation of the environment of the quantum processor.

Compared to filter multiplexers 100 and 200, filter multiplexer 300 has a greater number of switches but at least in part reduces signal distortion due to interference and signal loss due to inactive channels. Similar to filter multiplexer 200, filter multiplexer 300 has fewer number of lines from room temperature. This may be advantageous in quantum processors where a large number of filter cutoff frequencies is desired.

In alternative to the filter multiplexers 100, 200 and 300 of FIGS. 1, 2 and 3, respectively, a tunable filter may be employed to select, set or otherwise configure a desired annealing bandwidth.

Figure 4A:
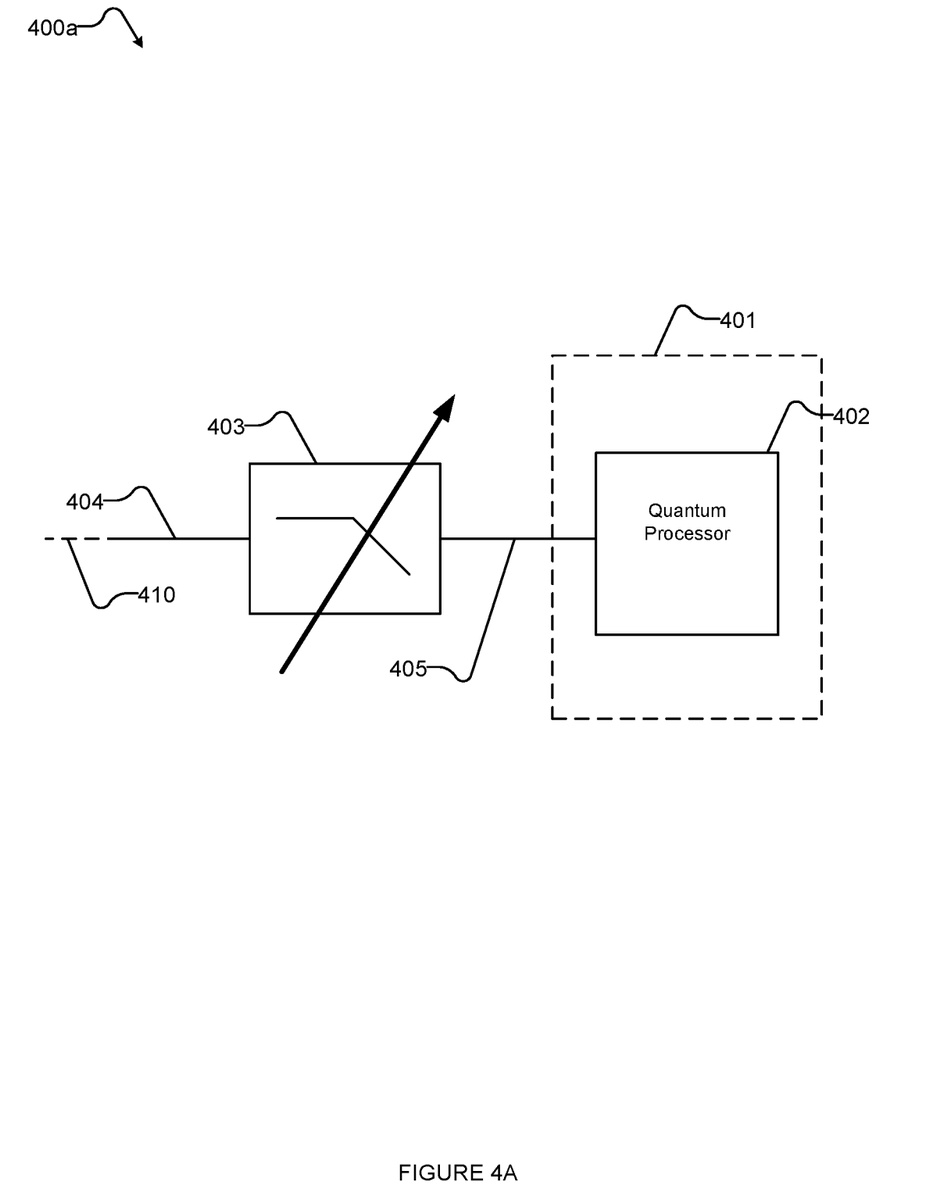
FIG. 4A is a schematic diagram of an example quantum computing system comprising a continuously tunable filter for annealing bandwidth selection, setting or configuration.

FIG. 4A is a schematic diagram of an example a quantum computing system 400a comprising a continuously tunable filter for annealing bandwidth selection, setting or configuration.

Quantum computing system 400a comprises a quantum computer 401. Quantum computer 401 may include one or more quantum processors, such as quantum processor 402. Quantum computer 401 can be provided in an isolated environment, for example, in an isolated environment that shields the internal elements of the quantum computer from heat, magnetic field, and other external noise (not shown). Quantum processor 402 includes programmable elements such as qubits, couplers and other devices. In accordance with the present disclosure, a quantum processor may be designed to perform quantum annealing and/or adiabatic quantum computation. Examples of quantum processor are described in U.S. Pat. No. 7,533,068.

Quantum computing system 400a comprises a continuously tunable filter 403, comprising an input line 404 and an output line 405. Input line 404 in communicatively coupled to at least one external annealing line 410 and output line 405 is communicatively coupled to quantum computer 401. Tunable filter 403 may be used to select, set or otherwise configure a continuously tunable annealing bandwidth for quantum computer 401.

Figure 4B:
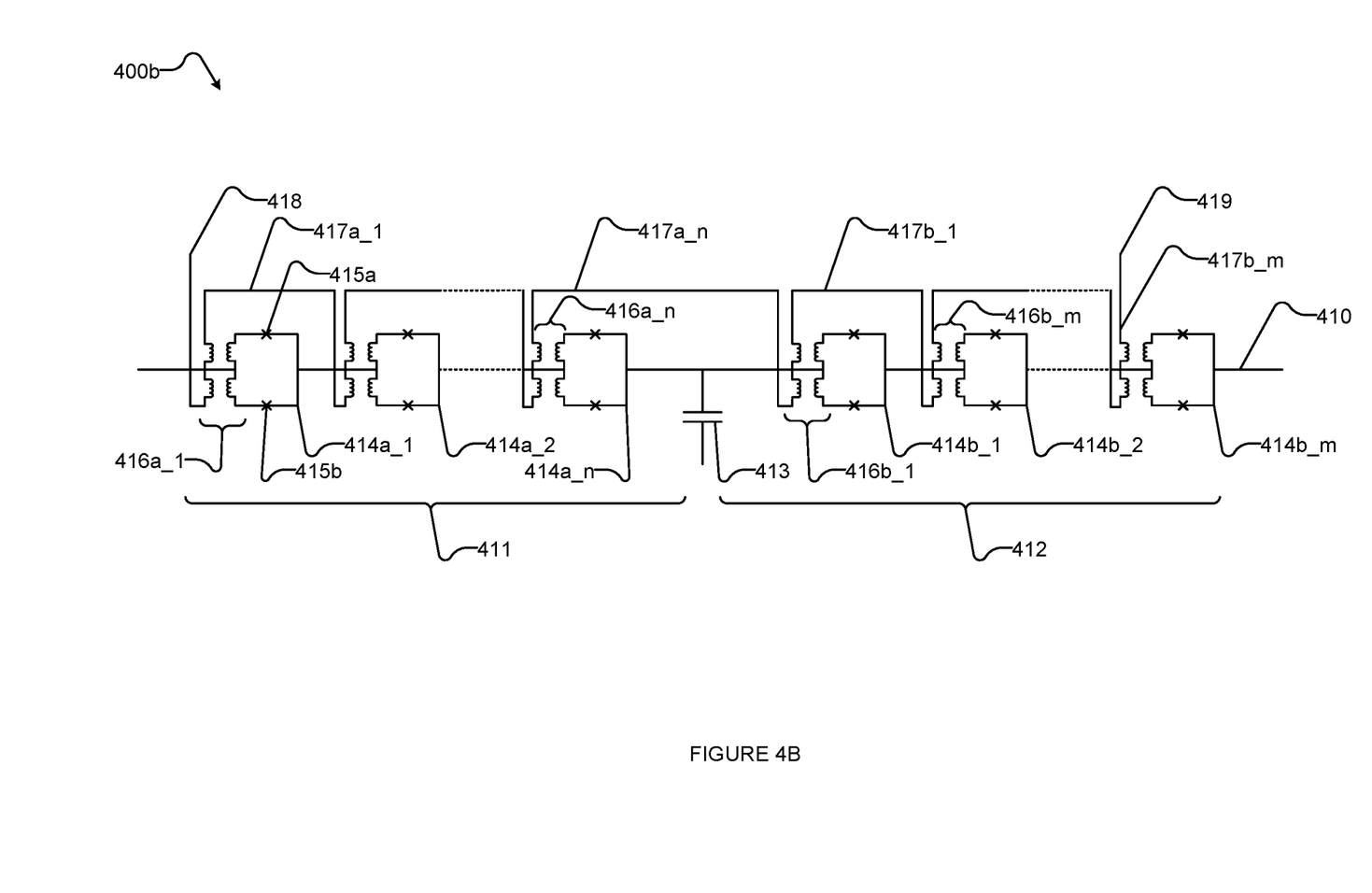
FIG. 4B is a schematic diagram of an example implementation of a single cascade element in the continuously tunable filter of FIG. 4A for tunable annealing bandwidth selection, setting or configuration.

FIG. 4B is a schematic diagram of an example implementation of a single cascade element 400b that may be used to implement a tunable filter for tunable annealing bandwidth selection, setting or configuration, for example tunable filter 403 of FIG. 4A. Cascade element 400b may be used as one of a plurality of cascade of elements as part of a tunable filter for tunable annealing bandwidth selection, setting or configuration and may be used with a quantum processor, for example, a superconducting processor.

Cascade element 400b comprises a transmission line 410. A first end of transmission line 410 (e.g., the right-hand side in the plane of the page of FIG. 4B) is electrically connected to a device (e.g., a superconducting processor, not shown in FIG. 4B) and a second end of transmission line 410 (e.g., the left-hand side in the plane of the page of FIG. 4B) is electrically connected to signal electronics (e.g., external annealing lines, not shown in FIG. 4B). External annealing lines may be in an exterior environment, at a different temperature than the temperature of the device.

Cascade element 400b comprises a first segment 411 and a second segment 412, where first segment 411 is on the left-hand side of a matching capacitor 413 in the plane of the drawing sheet of FIG. 4B, and second segment 412 is on the right-hand side of matching capacitor 413 in the plane of the drawing sheet of FIG. 4B. First segment 411 comprises a number N of DC-SQUIDs 414a_1 through 414a_n (collectively 414a) in series, and second segment 412 comprises a number M of DC-SQUIDs 414b_1 through 414b_m (collectively 414b) in series. In at least one implementation, the number of DC-SQUIDs 414a is equal to the number of DC-SQUIDs 414b. In some implementations, cascade element 400b may comprise RF-SQUIDs.

Each DC-SQUID 414a and 414b comprises a pair Josephson junctions 415a and 415b (collectively 415, only one pair called out in FIG. 4B to reduce clutter). Each Josephson junction of the pair of Josephson junctions 415 has a respective critical current Ic. Each DC-SQUID 414a and 414b is inductively coupled by inductance 416a_1 through 416a_n (collectively 416a, only one called out in FIG. 4B to reduce clutter) and 416b_1 through 416b_m (collectively 416b, only one called out in FIG. 4B to reduce clutter), respectively, to activation line loops 417a_1 through 417a_n (collectively 417a) and 417b_1 through 417b_m (collectively 417b), respectively.

Loops 417a are electrically coupled to activation line 418, and loops 417b are electrically coupled to activation line 419. Activation lines 418 and 419 are operable to cause the state of cascade element 400b to change from a filter with maximum cutoff frequency set by design to a filter with a reduced cutoff frequency, when used as part of a tunable filter. In some cases, it may be desirable for the cutoff frequency to be reduced to fully suppress signals, when cascade element 400b is used as a switching element.

Cascade element 400b is symmetric with respect to matching capacitor 413. Inductance 416a and 416b are approximately the same for DC-SQUIDs 414a and 414b, respectively, and junctions 415 have approximately the same critical current $I_c$ for DC_SQUIDs 414a and 414b. In some implementations, small variations during building and assembly may lead to values of inductance 416a and 416b and of critical current $I_c$ that are not identical for each DC-SQUID of DC-SQUIDs 414a and 414b.

Cascade element 400b can provide the same total inductance $L(\phi_x)$ and matching capacitance C as tunable filter 403 of FIG. 4A.

Other examples implementations of a continuously tunable filter are described in more details in U.S. patent application Ser. No. 16/397,790 (published as US Patent Application Publication No US20190369171A1).

Figure 5:
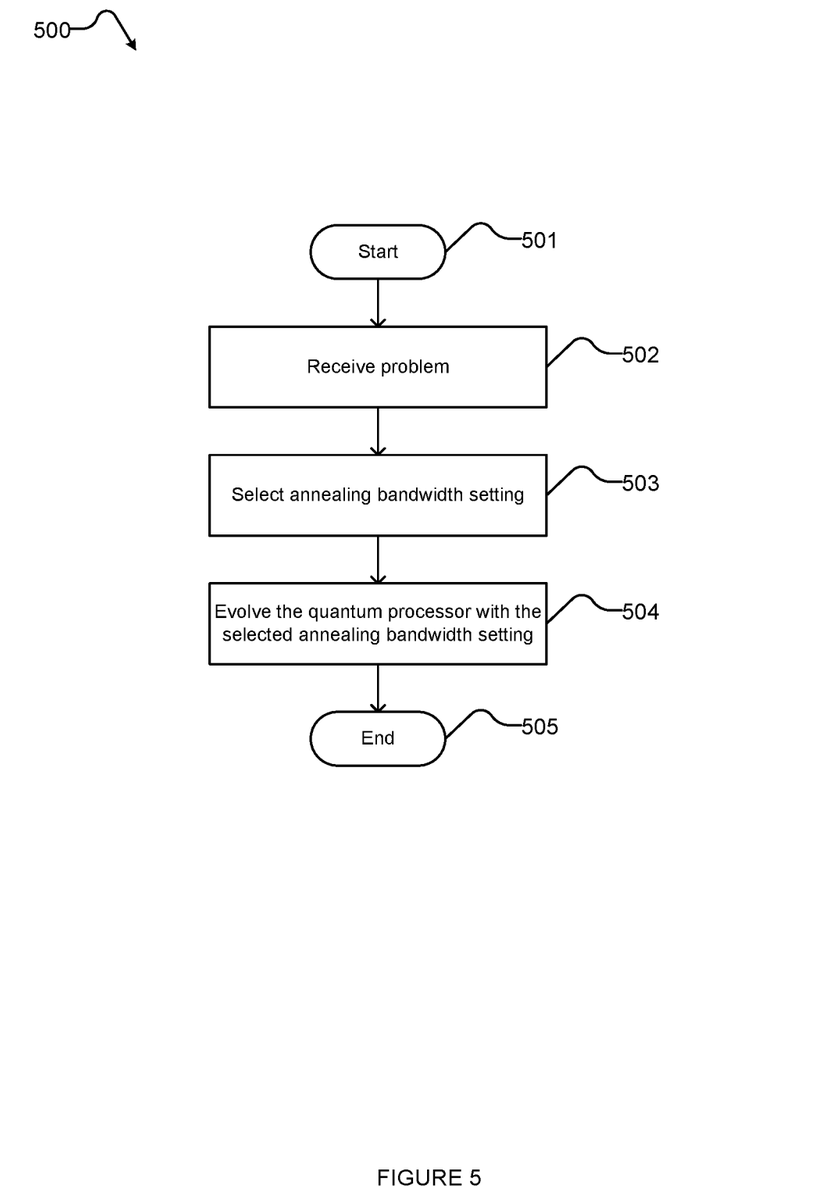
FIG. 5 is a flow diagram of an example method for quantum computation for selecting, setting or configuring an annealing bandwidth.

FIG. 5 is a flow diagram of an example method 500 for quantum computation for selecting, setting or otherwise configuring an annealing bandwidth. Method 500 may be executed by a hybrid computing system comprising at least one digital, or classical, processor, and a quantum processor. The quantum processor may be a superconducting quantum annealing processor. The hybrid computing system comprises a filter multiplexer or a continuously tunable filter to allow for annealing bandwidth selection, setting or configuration. Examples of filter multiplexers for annealing selection, setting or configuration are described in FIGS. 1, 2 and 3 and examples of continuously tunable filters are described in FIGS. 4A and 4B.

Method 500 may be used when it is desirable to select, set or configure an annealing bandwidth to operate the quantum processor according to a desired annealing schedule or annealing time. Method 500 comprises acts 501 to 505;

however, a person skilled in the art will understand that the number of acts is an example, and, in some implementations, certain acts may be omitted, further acts may be added, and/or the order of the acts may be changed.

Method 500 starts at 501, for example in response to a call from another routine.

At 502, the hybrid computing system receives an input problem. The input problem may be received by the at least one classical processor, together with other input data. The input problem may be a computational problem to be solved by the quantum processor. The input problem may be a calibration problem that it is desirable to solve with a large annealing bandwidth (i.e., a fast annealing time). The input problem may be a large-scale problem that it is desirable to solve with a small annealing bandwidth (i.e., a long annealing time).

At 503, the digital processor selects, sets or configures an annealing bandwidth that is desirable for the input problem. For example, for a calibration problem the digital processor may select, set or configure a large annealing bandwidth to achieve a fast annealing schedule. For superconducting qubits, a large annealing bandwidth may be, for example, 100 MHz to 1 GHz. For other physical systems (for example, fundamental particles, etc.), even larger bandwidths may be beneficial. If a slow annealing schedule is desired, the digital processor may select, set or configure a low annealing bandwidth setting. For superconducting qubits, a small annealing bandwidth could be, for example, 1 Hz. If problem performance with noise is of interest for diagnostic purposes, it may be desirable to select, set or configure an inappropriate setting or configuration. For example, a large annealing bandwidth may be used to intentionally introduce additional noise while performing a slow anneal. In one implementation, digital processor operates a switch select (for example switch select 107, 207 or 307a and 307b in FIG. 1, 2 or 3, respectively) to activate one pathway in the filter multiplexer.

At 504, the digital processor causes the quantum processor to start evolving with the selected, set or configured annealing bandwidth to solve the input problem. In at least one implementation the digital processor applies an embedding algorithm to the input problem before causing the quantum processor to start evolving.

At 505, method 500 terminates, until it is, for example, invoked again.

Figure 6:
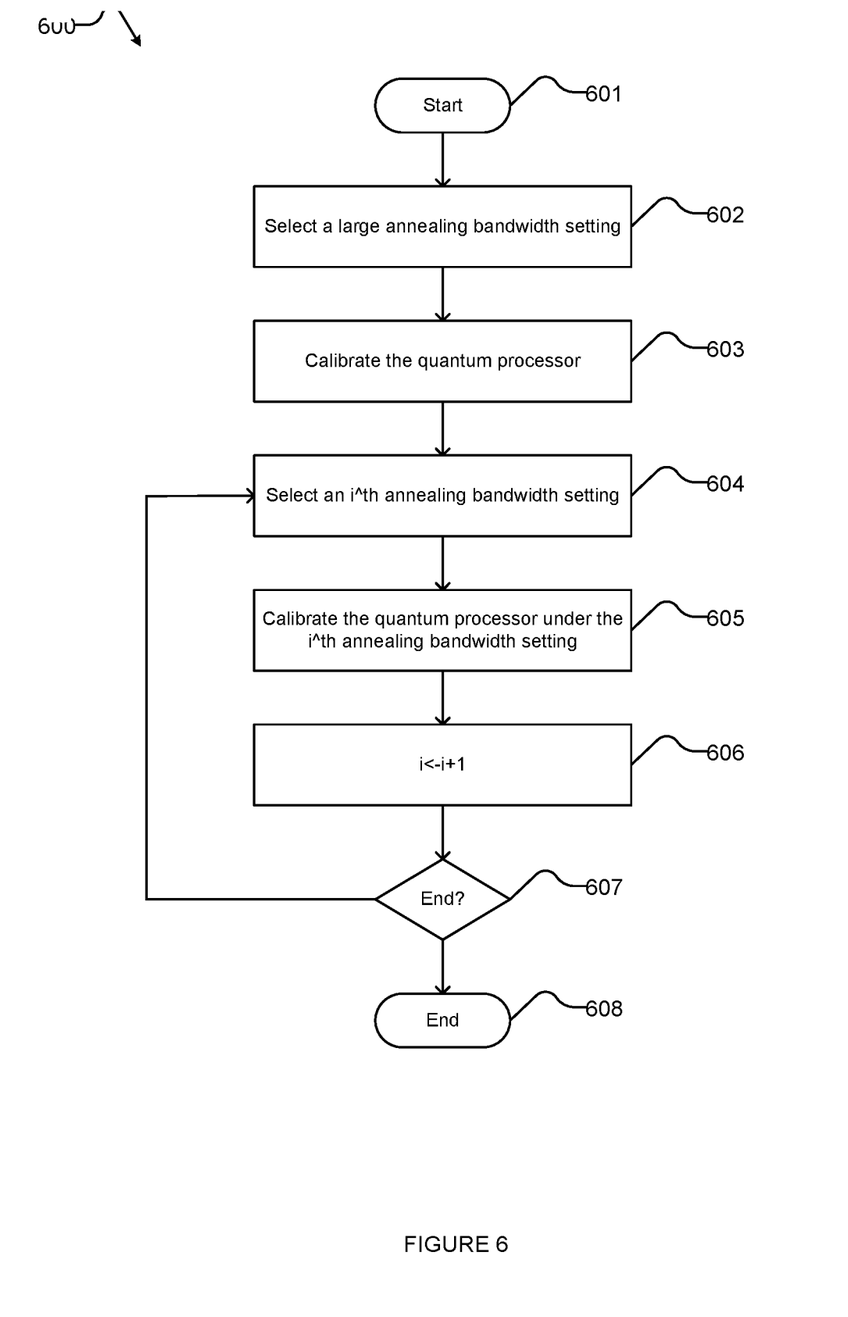
FIG. 6 is a flow diagram of an example iterative method for calibrating a quantum processor using different annealing bandwidths.

FIG. 6 is a flow diagram of an example iterative method 600 for calibrating a quantum processor using different annealing bandwidths. Method 600 may be executed by a hybrid computing system comprising at least one digital, or classical, processor, and a quantum processor. The quantum processor may be a superconducting quantum annealing processor. The hybrid computing system comprises a filter multiplexer or a continuously tunable filter to allow for annealing bandwidth selection, setting or configuration in-situ. Examples of filter multiplexers for annealing selection are described in FIGS. 1, 2 and 3 and examples of continuously tunable filters are described in FIGS. 4A and 4B.

Method 600 may be used when it is desirable to select, set or configure an annealing bandwidth to calibrate the quantum processor with a desired annealing schedule or annealing time. Method 600 performs a calibration of the quantum processor in all available annealing bandwidths. This ensures a nominal annealing schedule, independent of noise, is homogeneous for all the available annealing bandwidths. Method 600 comprises acts 601 to 608; however, a person skilled in the art will understand that the number of acts is an example, and, in some implementations, certain acts may be omitted, further acts may be added, and/or the order of the acts may be changed.

Method 600 starts at 601, for example in response to a call from another routine.

At 602, the digital processor selects, sets or configures an annealing bandwidth that is it desirable for calibrating the quantum processor. For example, the digital processor may select, set or configure a large annealing bandwidth to achieve a fast annealing schedule. For superconducting qubits, a large annealing bandwidth may be, for example, 100 MHz to 1 GHz. For other physical systems (for example, fundamental particles, etc.), even larger bandwidths may be beneficial. If problem performance with noise is of interest for diagnostic purposes, it may be desirable to select, set or configure an inappropriate setting or configuration. For example, a large annealing bandwidth may be used to intentionally introduce additional noise while performing a slow anneal. In one implementation, the digital processor operates a switch select (for example switch select 107, 207 or 307 and 307b in FIG. 1, 2 or 3, respectively) to activate one pathway in the filter multiplexer.

At 603, the digital processor causes the quantum processor to start a calibration routine with the annealing bandwidth selected at 602.

At 604, the digital processor selects, sets or configures a first annealing bandwidth, available from the filter multiplexer. In at least one implementation, a counter i=1, . . . n may be used, where n is the number of annealing bandwidths available in the filter multiplexer. For example, where the filter multiplexer is filter multiplexer 100 of FIG. 1, the digital processor may select, set, configure or activate pathway 105a.

At 605, the digital processor causes the quantum processor to start a calibration routine with the annealing bandwidth selected, set or configured at 604.

At 606, the counter i is incremented, i←i+1. If a counter is not used, act 606 is optional and method 600 proceeds to 607.

At 607, the digital processor checks that all available annealing bandwidths from the filter multiplexer have bene selected, set or configured. If all available annealing bandwidths have been selected, set or configured control passes to 608, otherwise to 604, where the digital processor selects another annealing bandwidth.

At 608, method 600 terminates, until method 600 is, for example, invoked again.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for example purposes only and may change in alternative examples. Some of the example acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the example methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: U.S. Pat. Nos. 8,008,991, 10,097,151, 8,670,809, US Patent Publication No US20170178018A1, US Patent Publication No US20190089031A1, U.S. patent application Ser. No. 16/397,790 (US Patent Application Publication No US20190369171A1), and U.S. Pat. No. 7,533,068.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A filter multiplexer system comprising:
at least one external annealing line;
a plurality of filters communicatively coupled to the at least one external annealing line, each filter of the plurality of filters having a different cutoff frequency; and
a multiplexer, the multiplexer having an output line and a plurality of input lines, each input line in the plurality of input lines communicatively coupled to one filter in the plurality of filters, and a plurality of pathways, each pathway comprising at least one superconducting switch.

2. The system of claim 1 wherein the at least one superconducting switch is a cryotron.

3. The system of claim 1 further comprising a plurality of external annealing lines, each external annealing line communicatively coupled to a respective one filter in the plurality of filters.

4. The system of claim 1 further comprising the output line of the multiplexer communicatively coupled to at least one on-chip annealing line, the on-chip annealing line communicatively coupled to qubits of a quantum processor.

5. The system of claim 1, further comprising a demultiplexer, the demultiplexer having one input line, communicatively coupled to the at least one external annealing line, and a plurality of output lines, each output line in the plurality of output lines communicatively coupled to one filter in the plurality of filters, the demultiplexer comprising a plurality of pathways, each pathway comprising at least one superconducting switch.

6. The system of claim 5 wherein the at least one superconducting switch is a cryotron.

7. A system for variable annealing bandwidth selection comprising:
a quantum annealing processor, the quantum annealing processor comprising a plurality of qubits and couplers, and a set of on-chip annealing lines, the on-chip annealing lines communicatively coupled to the plurality of qubits;
at least one external annealing line;
a plurality of filters communicatively coupled to the at least one external annealing line, each filter of the plurality of filters having a different cutoff frequency; and
a multiplexer, the multiplexer having an output line and a plurality of input lines, each input line in the plurality of input lines communicatively coupled to the at least one filter in the plurality of filters, and a plurality of pathways, each pathway comprising at least one superconducting switch.

8. The system of claim 7 wherein the quantum annealing processor, the plurality of filters and the multiplexer are housed at a same temperature as one another.

9. The system of claim 7, wherein the at least one superconducting switch is a cryotron.

10. The system of claim 7 further comprising a plurality of external annealing lines, each external annealing line communicatively coupled to a respective one filter in the plurality of filters.

11. The system of claim 7 further comprising the output line of the multiplexer communicatively coupled to at least one on-chip annealing line of the set of on-chip annealing lines.

12. The system of claim 7, further comprising a demultiplexer, the demultiplexer having one input line, communicatively coupled to the at least one external annealing line, and a plurality of output lines, each output line in the plurality of output lines communicatively coupled to a respective one filter in the plurality of filters, the demultiplexer comprising a plurality of pathways, each pathway comprising at least one superconducting switch.

13. A method for variable bandwidth annealing in a quantum annealing processor system comprising a quantum annealing processor, the quantum annealing processor comprising a plurality of qubits, and a set of on-chip annealing lines, the on-chip annealing lines communicatively coupled to the plurality of qubits; at least one external annealing line; a plurality of filters communicatively coupled to the at least one external annealing line, at least two of the plurality of filters having a different cutoff frequency from one another; and a multiplexer, the multiplexer having an output line and a plurality of input lines, the output line of the multiplexer communicatively coupled to the on-chip annealing lines, each input line in the plurality of input lines communicatively coupled to the at least one filter in the plurality of filters, and a plurality of pathways, each pathway comprising at least one superconducting switch, the multiplexer able to provide a plurality of annealing bandwidth settings, the method comprising:
setting an annealing bandwidth setting via the multiplexer; and
causing the quantum processor to evolve according to the annealing bandwidth setting.

14. The method of claim 13 further comprising receiving an input problem, the input problem having a desired annealing schedule; and wherein setting an annealing bandwidth setting to obtain the desired annealing schedule occurs before causing the quantum processor to evolve according to the set annealing bandwidth.

15. A method for calibrating a quantum annealing processor system comprising a quantum annealing processor, the quantum annealing processor comprising a plurality of qubits, and a set of on-chip annealing lines, the on-chip annealing lines communicatively coupled to the plurality of qubits; at least one external annealing line; a plurality of filters communicatively coupled to the at least one external annealing line, each filter of the plurality of filters having a different cutoff frequency from one another; and a multiplexer, the multiplexer having an output line and a plurality of input lines, the output line of the multiplexer communicatively coupled to the on-chip annealing lines, each input line in the plurality of input lines communicatively coupled to the at least one filter in the plurality of filters, and a plurality of pathways, each pathway comprising at least one superconducting switch, the multiplexer able to provide a plurality of annealing bandwidth settings, the method comprising:

setting a large annealing bandwidth setting via the multiplexer; and performing a calibration of the quantum processor while causing the quantum processor to evolve according to the large annealing bandwidth setting.

16. The method of claim 15, further comprising: iteratively, until all available annealing bandwidth settings have been set, selecting an $i^{th}$ annealing bandwidth setting via the multiplexer; and performing a calibration of the quantum processor while causing the quantum processor to evolve according to the $i^{th}$ annealing bandwidth setting.

\* \* \* \* \*